(12) United States Patent
Vanell (10) Patent No.: US 6,592,708 B2
(45) Date of Patent: Jul. 15, 2003

(54) FILTER APPARATUS AND METHOD THEREFOR

(75) Inventor: James F. Vanell, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/142,682

(22) Filed: May 10, 2002

(65) Prior Publication Data

US 2002/0127860 A1 Sep. 12, 2002

Related U.S. Application Data

(63) Continuation of application No. 09/407,211, filed on Sep. 28, 1999, now Pat. No. 6,423,638.

(51) Int. Cl.$^7$ .............................................. H01L 21/306
(52) U.S. Cl. .............................. 156/345.1; 156/345.12; 156/345.17; 156/345.18
(58) Field of Search .................. 438/690, 691, 438/692, 693, 698; 156/345.1, 345.12, 345.18, 345.17

(56) References Cited

U.S. PATENT DOCUMENTS

| | | | |
|---|---|---|---|
| 5,783,489 A | | 7/1998 | Kaufman et al. ............ 438/692 |
| 5,799,643 A | * | 9/1998 | Miyata et al. ................. 125/21 |
| 5,855,792 A | | 1/1999 | Adams et al. ............... 210/696 |
| 5,895,550 A | | 4/1999 | Andreas ................. 156/345.12 |
| 5,957,754 A | | 9/1999 | Brown et al. .................. 451/41 |
| 6,024,829 A | * | 2/2000 | Easter et al. ........... 156/345.12 |
| 6,106,714 A | * | 8/2000 | Chiu et al. ............. 210/321.63 |
| 6,126,531 A | | 10/2000 | Iida et al. .................... 451/447 |
| 6,406,364 B1 | * | 6/2002 | Kimura et al. .............. 451/446 |

* cited by examiner

Primary Examiner—Benjamin L. Utech
Assistant Examiner—Binh X. Tran (57) ABSTRACT

An ultrasonic driver (105) is used to vibrate a filter disk (103) at ultrasonic frequencies. Vibrations are used to break up agglomerates into smaller pieces that pass through filter disk (103). The energy is controlled to minimize the translational energy given to the particles as they are broken up to prevent reagglomeration. The frequency and amplitude of the vibration is controlled to operate out of or in low energy cavitation.

25 Claims, 2 Drawing Sheets

FILTER APPARATUS AND METHOD THEREFOR

This application is a continuation of 09/407,211 filed Sep. 28, 1999, now 6,423,638.

BACKGROUND OF THE INVENTION

The present invention relates, in general, to filtering, and more particularly, to filtering a colloidal suspension used for planarizing semiconductor wafers.

Chemical mechanical planarization (CMP) is used to planarize features in the manufacture of advanced integrated circuits. CMP is used in almost all stages of semiconductor device fabrication. For example, chemical mechanical planarization allows the creation of finer geometry structures via local planarization and for global wafer planarization to produce high density vias and interconnect layers. Materials that undergo CMP in an integrated circuit manufacturing process include single and polycrystalline silicon, oxides, nitrides, polyimides, aluminum, tungsten, and copper.

In the semiconductor industry, a semiconductor wafer is held by a wafer carrier of a chemical mechanical planarization tool during a polishing process. Thus, CMP is also referred to as chemical mechanical polishing. A slurry comprising a colloidal solution that includes both abrasives and chemicals for removing-materials on the semiconductor wafer is applied to the surface of a polishing media. The polishing media is compliant and provides for the transport of the slurry. The polishing media is placed on a rotating disk known as a platen. The wafer carrier brings the semiconductor wafer in contact with and coplanar to the surface of the polishing media. A predetermined force is applied by the wafer carrier to ensure the slurry abrades the surface of the semiconductor wafer. Typically, both the wafer carrier and the platen are rotating during the polishing process.

The type of chemicals and abrasives used in the polishing process vary depending on the materials being removed from the semiconductor wafer. The limits of the polishing process are, in a large part, controlled by the size of particles in the polishing slurry. Semiconductor manufacturers typically do not filter polishing slurry during semiconductor wafer processing. Filtering is very costly if used on colloidal suspensions due to filter cost and the need for continuous maintenance of the filters. There are also problems with particle shedding from the filter, low flow rates due to blinding, and loss of adequate solids in the colloidal suspension. The absolute limit on particle size is determined by the chemical supplier producing the polishing chemistry. The time delay between shipment and usage at the semiconductor manufacture site allows the polishing slurry to agglomerate producing larger particles. Mechanisms that increase agglomeration are chilling, drying, and excessive agitation. The larger particles produce scratches on the semiconductor wafer during the polishing process that can affect wafer yields and product reliability.

Accordingly, it would be advantageous to have a filter capable of filtering a colloidal suspension with a flow rate that allows real-time filtering in an industrial application. More specifically, it is desirable that the filter allows point-of-use filtering on a chemical mechanical planarization tool, reduces particle size to an optimal number and increase uniformity of the polishing slurry. It would be of further advantage if the filter required little or no maintenance and have no impact on the semiconductor wafer throughput in the factory.

DETAILED DESCRIPTION OF THE DRAWINGS

In general, chemical mechanical planarization (CMP) is used to remove material to achieve planarity or to remove a global film from a processed side of a semiconductor wafer. Ideally, a uniform amount of material is removed from across the semiconductor wafer leaving a highly planar surface on which to continue wafer processing. Any non-uniformity in the polishing process may result in a loss of yield or long term device reliability problems. Uniformity is the measure of variation in surface height across a semiconductor wafer. Some common types of chemical mechanical planarization processes in the semiconductor industry are used to remove oxides, polysilicon, tungsten, and copper.

Chemical mechanical planarization tools currently used in the semiconductor industry are capable of achieving wafer uniformity in the range of 6–12 percent. This level of uniformity is sufficient for building devices having critical dimensions in the range of 0.18 to 0.35 microns. In the future, polishing uniformity in the range of 1 to 3 percent will be required as the semiconductor industry moves towards critical dimensions of 0.10 microns and below. The planarization problem will be further exacerbated as the semiconductor wafer diameters increase from 200 millimeters to 300 millimeters.

Two factors have been identified by the semiconductor industry as having a significant impact on the viability of chemical mechanical planarization at smaller dimensions and larger wafer sizes. As mentioned hereinbefore, the planarity across a polished semiconductor wafer, as well as the planarity across an individual die, is one factor that is critical in the formation of devices and interconnect structures at very small dimensions. The other factor is scratches that occur due to large abrasive particles in the polishing slurry. The size and frequency of the scratches can impact wafer yields and affect the long term reliability of the devices.

Ideally, a polishing slurry comprises abrasive particles having a size distribution in a narrow range, i.e., the abrasive particles are of uniform size and the abrasive particles are distributed in a constant density throughout the slurry. In practice, most polishing slurry is delivered from a chemical supplier having a wide distribution of particle sizes. The polishing slurry is not used immediately by a semiconductor manufacturer allowing agglomeration to occur between the delivery time and the time of use. Agglomeration is the formation of a larger particle by the action of two or more particles combining together. Agglomeration widens the particle size distribution and degrades the quality of the polishing slurry. In fact, there are certain types of polishing slurries that would be extremely effective in polishing semiconductor wafers but have been rendered unusable due to the agglomeration problem. Chemical mechanical planarization may not be feasible at small feature sizes for semiconductor wafer processing without control over the particle size and distribution at the time of use.

At this time, the particle size distribution is determined by the manufacturers of polishing chemistries. The chemical manufacturers use depth media filters to filter out particles above a predetermined size. The problem with using depth media filters is they rapidly plug up requiring constant monitoring, maintenance, and replacement. Depth media filters, membrane filters, or the like would not work efficiently in a semiconductor manufacturing environment since the equipment needs continuous maintenance as the filters become blinded or plugged thereby affecting wafer processing quality and throughput. Similar arguments could be made against the use of depth media filters in applications for colloidal suspensions outside of the semiconductor industry such as the cosmetic industry or the medical industry. The chemical supply companies that provide CMP slurries are forced by the semiconductor manufacturers to prefilter their product prior to shipping to the end user thereby bearing the burden of the high maintenance requirements of the filtering process as well as the quality and yield reduction issues. The chemical companies add the cost of filtering to the price of the polishing slurry which increases the cost of manufacturing integrated circuits. Furthermore, while it is economically desirable to transport and store concentrated slurry and then dilute to end use concentration at point of use/time of use, the resulting agglomerates formed during dilution could cause severe wafer damage. Some type of filtration is required to remove the agglomerates prior to use. The sheer quantity and size of the agglomerates causes rapid filter blinding and plugging. The difficulty of maintaining proper slurry particle size, distribution and density is a daunting technical challenge for the end user of colloidal suspensions. In essence, semiconductor manufacturers are paying the chemical manufacturers to dilute their polishing chemistries and to filter the diluted slurry to ensure a specified particle size and density when it leaves their factories.

The process of filtering is well known in the scientific arts for removing particles above a specified size from solids or liquids. A filter typically has openings to pass materials smaller than the opening size or has a membrane which selectively allows materials to pass through. The openings in the filter or the membrane largely determine the size of particles allowed to pass through. One constant in all filter methodologies is a gradient across a filter element that forces the material being filtered through the filter element. For example, a pressure gradient is a physical mechanism by which a material is forced to pass through a filter. An electrical field or magnetic field is another mechanism used to force material through a filter.

As described hereinbefore, one common type of filter used to remove particles having a size greater than a predetermined value from a colloidal suspension is a depth media filter. A pressure gradient forces the colloidal suspension through the depth media filter. A depth media filter comprises layers of amorphous fibers or filaments. The amorphous fibers produce random pathways through the filter that allow smaller particles to readily pass through. A depth media filter such as, for example, a polypropylene filter is a true three dimensional filter whereby the spacing of the fibers per unit area and the density of the fibers determine the filter characteristics.

During a filtering process, a pressure gradient holds larger particles of the colloidal suspension as the surface of the filter reducing the apparent pore size of the filter. Blocking the surface of a filter is known as filter blinding. Blinding reduces the flow rate of the filter. Particles also become trapped within the filter. This phenomenon is called filter plugging. The size of the trapped particles can be greater than the nominal filter pore size. Some of these trapped particles can work their way through the filter into the filtered side of the colloidal suspension in a process called shedding.

In general, the performance of a filter is characterized by the distribution of particle sizes produced by the filter in actual use. One measurement of filter performance is the nominal size of particle removed by the filter. Another measure of filter performance is the absolute rating which represents the smallest particle that the filter will remove with near-100 percent efficiency. Typically, a colloidal suspension filtered with a depth media filter will have particle size distribution pattern that is shaped like a bell curve. The larger particles that are not post-filtration agglomerates and that work through the filter are responsible for wafer scratching. Thus, depth media filters do not sufficiently filter particles to meet the yield requirements of the semiconductor industry at small device geometries and larger wafer sizes because of losses due to scratching and gouging.

A method and filter apparatus is described hereinafter that allows the filtering of a colloidal suspension at time of use. Time-of-use filtering provides many benefits. A first benefit of time-of-use filtering is a reduction in cost. Semiconductor manufacturers will not have to pay chemical companies to dilute and filter polishing chemistries as currently provided. A second benefit of receiving non-dilute slurries is more control over the exact chemistry at the time of use. This will allow semiconductor manufacturers to customize the rate of material removal via the chemistry for a specific process flow. A third and substantial benefit of time-of-use filtering is that it opens the possibility of using a number of polishing chemistries that previously were not considered because of agglomeration problems. A fourth benefit of time-of-use filtering is a modification of the particle size distribution. In particular, tightening the particle size distribution more towards the ideal will further the migration of chemical mechanical planarization processes towards smaller device geometries. Finally, the filter can be placed at the point of use of a manufacturing process. Point-of-use filtering ensures an optimal size particle distribution of the slurry as it is being used in the manufacturing process. Point-of-use filtering will increase manufacturing yields and long-term component reliability.

Time-of-use filtering of a colloidal suspension is achieved, in part, by breaking apart agglomerates prior to filtering. In other words, the colloidal suspension is reengineered to reduce the size of the larger particles to smaller particles. The reengineering of particles in the suspension greatly reduces the size of the particles that blind the filter and moves the particle size distribution more towards the ideal. Real-time use implies that a continuous flow rate can be achieved that would allow the efficient use of the filter in a manufacturing environment.

Inherently, filters available on the market rapidly blind as the large particles in a colloidal suspension are prevented from passing through the filter. Over time, the rating of the filter is changed as particles are trapped at the surface of the filter or within the filter. In general, the trend is to remove smaller and smaller particles as particles plug or blind the filter. The changes in apparent filter rating correspond to lower flow rates and reduced overall abrasive particle counts. At some point, the flow rate and the polish rate will not be sufficient to meet the needs in a manufacturing environment. For example, tests using depth media filters to filter colloidal suspensions used for the planarization of semiconductor wafers blind to the point where the flow rate of the filter is compromised within a matter of seconds, especially when diluting slurry with deionized water.

Other means have been employed to maintain filter flow rates with standard filters available on the market. Periodically flushing the large particles from the filter and removing them from the filter system is one technique. The example described above where the filter blinds within seconds or even minutes would not be a candidate for flushing because a continuous slurry flow rate required in a manufacturing environment could not be maintained. In other words, the filter process would constantly be starting and stopping to flush particles thereby reducing wafer throughput from the factory.

Another technique to prevent blinding is sweeping. Sweeping is a process of producing a shear action across the surface of a filter to remove particles from the surface. Freeing up the surface by sweeping would not produce the desired results in a colloidal suspension. Particles moved from the surface by the sweeping process are moved into the path of incoming particles producing even more agglomerates. The ever-accumulating large particles being thrown away from the filter surface through the sweeping action eventually form a blockage to the filter and reduce flow rates and thus is not capable of meeting the continuous real-time flow rates required in a manufacturing environment.

Continuously reengineering the colloidal suspension reduces the large particle count to a level in which blinding does not occur in the filter for time periods acceptable for real-time filtering. For example, the colloidal suspension in a semiconductor wafer chemical mechanical planarization process which blinds a standard filter in seconds would build up particle counts affecting flow rates after several hours through the reengineering process. This time scale corresponds to a time period greater than the time required to process an entire lot of semiconductor wafers. Thus, the filter could be flushed of the particles at a time when a new wafer lot is being introduced in the planarization process or when other events occur in the planarization process producing a downtime corresponding to the length of time required to flush the filter thereby having no impact on wafer throughput.

Energy is put into the colloidal suspension to break apart the agglomerates prior to filtering. For example, energy sources such as electrical, magnetic, acoustic, and light are used to raise the kinetic energy of the colloidal suspension. In particular, the energy is applied to the agglomerates to separate particles of an agglomerate from one another. In an embodiment of the filter, acoustic energy is used to break apart large particles of the colloidal suspension. A micronic screen comprising a metal mesh is used as a filter element. An ultrasonic probe is placed in contact with or in proximity to, the screen to vibrate the filter. The frequency and amplitude of the vibration is selected and corresponds to the particles' size range and the characteristics of the colloidal suspension.

The ideal screen for reengineering a colloidal suspension is a true two-dimensional filter. A true two-dimensional filter has openings corresponding to the maximum particle size being passed through the filter and has a thickness approaching zero, i.e., a depth of zero. The two-dimensional filter is capable of receiving and vibrating at a frequency output by a vibratory element, such as, for example, an ultrasonic probe. Wire mesh filters are formed from woven layers of wire mesh. The wire mesh is woven to produce a nominal opening size. The wire mesh filter, unlike a depth media filter, is closer to a two-dimensional filter in that particles typically do not get trapped between layers of the wire mesh.

The process of reengineering the particle size distribution of a colloidal suspension is best understood by analyzing the principles which cause agglomeration. Prior to use, agglomeration of particles within a colloidal suspension is one cause of particles being greater than the nominal size. Agglomeration is the formation of larger particles from smaller particles. Agglomeration fundamentally is caused by thermodynamic forces that seek to minimize surface energy and by Van der Waals bonding. This surface energy is primarily due to unoptimized surface atomic bonds. Many factors increase the rate of agglomeration within a colloidal suspension. High temperatures and shear give the particles sufficient energy to agglomerate. Changes in the electrolyte concentration or pH can reduce surface charge that prevent particles from agglomerating. Drying of the colloidal suspension reduces the barrier by physically forcing particles closer together. Low temperature can produce a saturated solution and subsequent precipitation of desolved solids in the colloidal suspension. Finally, contamination or missing components in the colloidal suspension can accelerate an agglomeration process.

It is of particular importance to note that slurry chemical manufacturers go to great lengths to prevent agglomeration. Their techniques have been developed to minimize agglomeration between the time the chemical mixture leaves the factory and it is used by the end user. Electrostatic stabilization is a technique whereby particles of the colloidal suspension are given a surface charge of large magnitude and the same sign to cause particle-to-particle repulsion. There are at least three different ways commonly employed to change the magnitude of charge and the charge sign of particles in a colloidal suspension. A first method controls the pH of the colloidal suspension to affect ions contributing to surface charge. A second method controls the electrolyte concentration or type to affect ions contributing to surface charge. A third method is the adsorption of specific organic or inorganic substances to occupy available bonding sites to change surface charge. A method that is effective in preventing agglomeration without changing the charge on particles of the colloidal suspension is stearic stabilization. Stearic stabilization is the adsorption of an organic substance onto the surface of particles that physically prevents intimate contact between particles.

As mentioned previously, the frequency and amplitude selected for vibrating the two-dimensional filter corresponds to the size of the particles being filtered. A factor in the frequency and amplitude selection are the techniques employed by the chemical manufacturers to prevent agglomeration. The filtering technique should not change the particle charge or remove coatings that prevent agglomeration. Upsetting the charge or chemistry of a colloidal suspension can easily occur when energy is applied to particles of the-colloidal suspension. Applying a shearing force on the particles or in general, hitting the particles together with too much force can modify the qualities of the colloidal suspension. In other words, imparting the energy to the particles in the wrong amount or in the wrong way will create a situation where particles rapidly agglomerate after filtering has occurred. Reagglomeration after filtering would produce disastrous consequences in a manufacturing environment since no control over the particles' size distribution would result.

In an embodiment of the filter, the wire mesh screen is vibrated at ultrasonic frequencies or greater i.e., 20 Khz or greater. A colloidal suspension is brought under pressure to the filter element. The larger particles are forced against the screen. In theory, a high frequency, low amplitude vibration of the screen impacts the larger particles separating them into smaller particles without changing the chemistry as provided by the chemical manufacturer. For example, a high charge or isolation coating on the smaller particles would remain intact after filtering. The theory was tested by measuring the rate of agglomeration in a non-filtered sample in a steady state. After filtering, the same test was performed with no degradation in the rate of agglomeration thus implying that the mechanisms to prevent agglomeration were not changed during the filtering process.

The vibration frequency and amplitude of the vibration is also selected to limit the movement of the components of the broken up large particles. For example, an incorrect frequency and amplitude could impart significant translational motion to the smaller particles during the deagglomeration/filter process. This would result in no gain, or worse, an increase in the number of agglomerates. If particles broken up from a larger particle were given sufficient translational motion to move them in proximity or in shearing contact with other particles approaching the filter element, new agglomerates could form. Limiting the translational motion of deagglomerated particles allows them to be filtered immediately before any reagglomeration occurs.

Another factor in the design of the filter is found by studying what occurs when the filter element moves through a colloidal suspension. Movement of the filter at high speeds will produce localized cavitation. Cavitation is the formation of cavities or bubbles in a liquid medium. The back and forth movement of the filter element pushes and pulls the liquid near the filter element. Gas pockets may form and expand with the impressed ultrasonic field when the pressure of the wave is below ambient. There are two types of cavities that are produced when cavitation occurs. A first type is produced from dissolved or trapped gasses in the liquid or on surfaces in contact with the liquid. The first type of cavitation is of relatively low intensity. A second type is produced by vapors of the liquid itself. Vaporous cavitation is a high intensity event.

Cavitation dissipates the energy of the ultrasonic wave and impedes transmission past the areas of cavitation due to scattering. The violence of cavitation is a function of the ratio of the bubble radius at the instant before collapse to the minimum radius before expansion. The most violent cavitation occurs when the bubble can reach a radius where it will collapse catastrophically in less than one-quarter cycle of the impressed wave. The critical bubble radius is a function of wavelength. The intensity of cavitation depends upon the dimensions of the cavitation nuclei, the wavelength of the sound field, and the intensity of the sound field.

Most liquids contain nuclei about which cavitation bubbles originate. These nuclei may consist of dispersed dust particles prominence on immersed surfaces, or minute gas bubbles. Highly localized stresses are developed during the formation and subsequent collapse of cavitation bubbles. Temperatures may reach 7,204 degrees Celsius and pressures may reach as high as 52,732,500 Kilograms/square Meter. The violent nature of a cavitation event can produce catastrophic problems in the filter. For example, cavitation increased chemical activity that can rapidly erode components of the filter system, such as the ultrasonic probe or the filter element. Erosion of the ultrasonic probe could change the vibration dispersion pattern, frequency, amplitude, or produce a complete failure of the probe. Erosion of the filter element could produce larger openings which would allow larger particles to pass through and ultimately lead to the filter element failing. Similarly, the high temperatures and pressures produced in cavitation can fatigue and produce mechanical failure in the filter components thereby preventing use in a manufacturing environment where long term reliability is essential. The chemical characteristics of the colloidal suspension can also change due to cavitation rendering it useless or less effective for the manufacturing application. Cavitation can rupture or fragment suspended particles, emulsify the colloidal suspension, and disperse particles that are too small throughout the suspension.

An example of a filter process best illustrates how driver frequency and cavitation relate to filter operation. For example, a colloidal suspension of, for example, spherical particles, has a distribution of particles having a diameter greater than 0.2 microns. Ideally, after filtering the diameter of the particles in the colloidal suspension is less than approximately 0.2 microns. Vibrating the filter element at a wavelength equal to the particle largest dimension would break apart agglomerates with little or no translational motion. In practice, it may be found that best results are produced by selecting a frequency having a wavelength equal to a nominal particle size of the particles that need to be reengineered. For example, a frequency of vibration of 7.6 gigahertz has a wavelength of approximately 0.2 microns. Vibrating a filter element such as a wire mesh filter at this speed is unrealistic. The filter element would rapidly fatigue and eventually break. Moreover, the spreading of energy in a colloidal suspension would be very poor at a frequency this high. Furthermore, movement of the filter element would have to be restricted to extremely small displacements. At this time, there is no available filter material capable of withstanding the tensile stress caused by continuous movement at these speeds.

The frequency of operation is reduced to a point where the filter element and the ultrasonic driver will survive under the long-term use required in a manufacturing environment. The frequency is also selected based on the characteristics of the ultrasonic driver. A piezo-electric driver is commonly used to produce vibrations at ultrasonic frequencies. An embodiment of an ultrasonic driver custom built for use in a filter application includes a tuned mass of low inertia that is corrosion resistant. The tuned mass allows accurate and stable vibrations to be produced at power levels needed to reengineer agglomerates of a colloidal suspension. A low inertia element requires less energy to move and is less prone to fatigue that could result in failure of the ultrasonic driver. The ultrasonic driver is also subjected to corrosive chemicals if used in an application such as the chemical mechanical planarization of semiconductor wafers. An ultrasonic driver meeting these requirements was not commercially available. The custom ultrasonic driver that was fabricated to meet these requirements listed above has a power output that exceeds 100 watts. In an embodiment of the filter, the ultrasonic driver operates at a frequency of approximately 132 kilohertz. A stainless steel wire mesh filter can be reliably vibrated at this frequency for extended periods of time without fatigue or failure.

In general, most colloidal suspensions will contain dissolved gases. Operating at the lower ultrasonic frequencies will provide sufficient time and displacement to form bubbles. Cavitation that is destructive to the filter process will occur if not controlled. Controlling where cavitation occurs and how it occurs can have a positive impact on the filtering process. The cavitation is kept at a low energy or low intensity to prevent the occurrence of detrimental effects. Operating at a desired or selected frequency removes gas from the colloidal suspension producing bubbles that collapse thereby giving up energy. The frequency is selected to produce cavitation more frequently in the bulk volume of the colloidal suspension than on surfaces such as the filter element or the ultrasonic driver. As noted above, this type of cavitation produced from dissolved or trapped gasses in the liquid or on surfaces of the filter element in contact with the liquid is of relatively low intensity. This low intensity cavitation allows adequate spread of ultrasonic energy throughout the filter volume, deagglomeration of slurry via moderate cavitation energy, and minimized erosion of filter element and ultrasonic driver surfaces. Further, the wavelength of the ultrasonic sound wave is of sufficient magnitude to cause the filter element oscillations that adequately impact large slurry particles to reengineer them to acceptable smaller sizes for CMP processing. In addition, the power level is selectable and is set at a level to prevent excessive cavitation while maintaining sufficient kinetic energy to move the stainless steel mesh of the filter. The custom designed ultrasonic driver for filter applications has an adjustable power level from 40 watts to 200 watts.

In an embodiment of the filter, the distance between the ultrasonic driver active surface and the stainless steel filter mesh, i.e. the filter element, is adjustable to allow the ultrasonic energy to be optimally spread across the projected area of the stainless steel filter mesh. This is made possible by the fact that the stainless steel filter mesh is slightly bowed toward the ultrasonic driver by the upstream pressure of the solution to be filtered. Because the filter element is bowed, it is nonplanar and intersects the ultrasonic waveform at more than one location. In other words, the filter surface will intersect a range of points along the ultrasonic waveform. The most kinetically energetic parts of the ultrasonic wave are at the quarter and three quarter wavelength nodes. Energy near either of these nodes is spread across the stainless steel filter mesh annularly. By spreading the energy, cavitation on the stainless steel filter mesh is reduced since no one point has sufficient energy to cause cavitation; although cavitation does not occur, there is sufficient displacement to cause physical impact with and breakup of the agglomerated particles.

In an embodiment of the filter, the ultrasonic frequency is varied approximately (+/−) 1 kilohertz to move the waveform around on the stainless steel filter mesh as well as in the bulk of the solution to be filtered. This allows improved filter area utilization and prevents filter blinding in areas of the filter element that otherwise would be less kinetically energetic. Varying the frequency of the ultrasonic waveform, i.e., the kinetic energy of the ultrasonic waveform, on all the wetted surfaces of the filter prevents particle settling and agglomeration. This frequency shifting is performed up to 1000 times/second.

Figure 1:
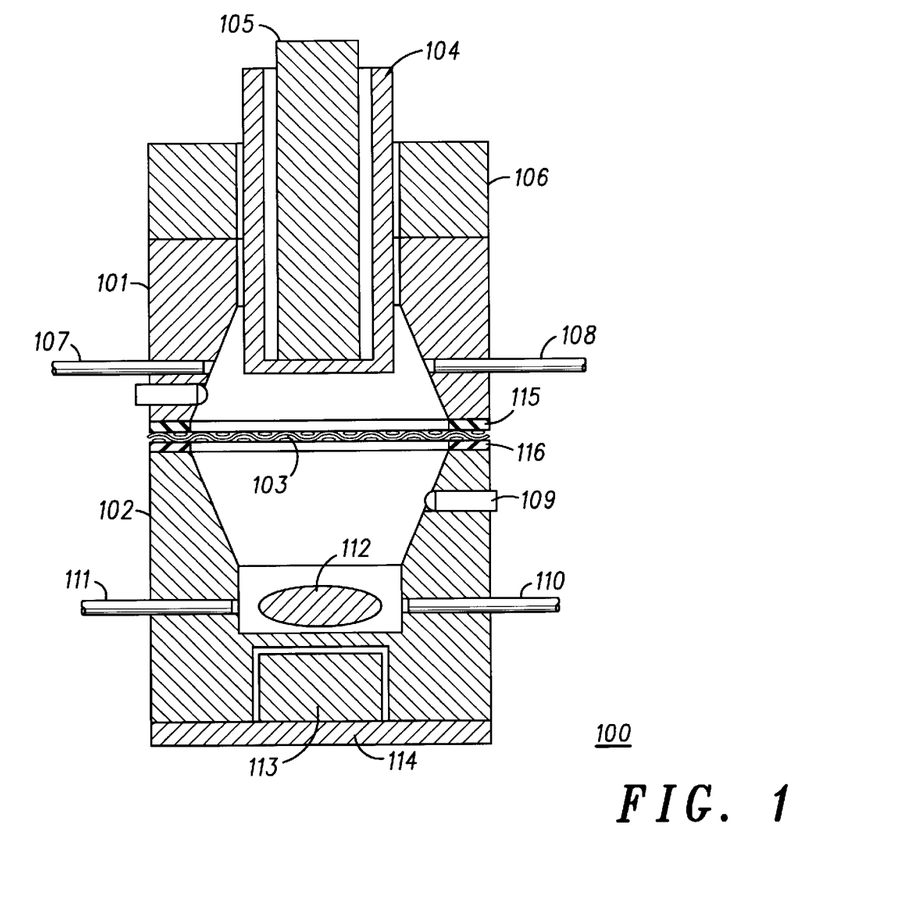
FIG. 1 is a cross-section of a filter in accordance with the present invention.

FIG. 1 is an embodiment of a filter 100 for time-of-use filtering of a colloidal suspension having flow rates sufficient for use in a manufacturing environment in accordance with the present invention. A chamber is used to hold a volume of colloidal suspension. The chamber comprises an upper filter chamber 101 and a lower filter chamber 102. A filter disk 103 separates upper filter chamber 101 from lower filter chamber 102. A volume of unfiltered colloidal suspension is brought into lower filter chamber 102 under pressure. An ultrasonic driver 105 vibrates filter disk 103. The particles of the colloidal suspension that are unable to pass through filter disk 103 are reengineered into smaller particles by filter disk 103. The reengineered smaller particles pass through filter disk 103 into upper filter chamber 101. The filtered colloidal suspension in upper filter chamber 101 is provided for use in a manufacturing application.

The chamber volume of filter 100 is kept as small as possible to minimize waste of materials and to maximize ultrasonic energy efficiency when operating filter 100. In an embodiment of filter 100, for filtering colloidal suspensions used in the chemical mechanical planarization of semiconductor wafers, the chamber has a volume of approximately 50 cubic centimeters or less. The small size of the filter allows it to be built as an integral part of the on-board chemical dispense system of a chemical mechanical planarization tool. Building filter 100 into the on-board chemical dispense system allows slurry filtering immediately before use on the platen.

Upper filter chamber 101 and lower filter chamber 102 have a conical taper to reduce the volume. The maximum diameter of both upper filter chamber 101 and lower filter chamber 102 occurs centrally where they meet at filter disk 103. The effective filter area of filter disk 103 is a factor in determining the flow rate of filter 100 and is used to determine the maximum diameter of the chamber. For example, in an application for filtering colloidal suspensions used in chemical mechanical planarization of semiconductor wafers, a stainless steel mesh filter has a diameter of approximately 11.7 centimeters. The minimum diameter of upper filter chamber 101 and lower filter chamber 102 occurs distally to the filter disk 103. In an embodiment, of filter 100 the minimum diameter of upper filter chamber 101 is determined by the diameter of ultrasonic cup 104 that houses an ultrasonic driver 105. The minimum diameter of lower filter chamber 102 is determined by a magnetic stirrer 112.

Lower filter chamber 102 includes a port 110, a port 111, and a pressure sensor 109. Port 110 and port 111 are respectively an input port and an output port for providing and removing materials. Lower filter chamber 102 receives unfiltered colloidal suspension. Materials such as colloidal suspension, cleaning agents, and DI water are provided through port 110 into lower filter chamber 102.

A magnetic stirrer 112 resides within lower filter chamber 102. Magnetic stirrer 112 is a structure that rotates within the filtered colloidal suspension. A recess is formed in lower chamber 102 to hold a magnetic stirrer driver 113. Magnetic stirrer driver 113 uses rotating magnetic fields to move magnetic stirrer 112. Mixing the colloidal suspension with magnetic stirrer 112 provides the benefit of moving particles that cannot be reengineered from filter disk 103 back into the unfiltered volume of the colloidal suspension thereby preventing blinding of the filter element. A base plate 114 fastens to the bottom of lower filter chamber 102 to cover magnetic stirrer driver 113 and to maintain contact between magnetic stirrer driver 112 and lower filter chamber 102.

Pressure sensor 109 is used to sense the pressure upstream in filter 100. Under steady-state filter operating conditions the pressure in lower filter chamber 102 remains relatively constant. Over extended periods of time, the number of particles that cannot be reengineered increases to a level where they blind a portion of filter disk 103. The pressure in lower filter chamber 102 increases as filter disk 103 blinds which is detected as a pressure increase by pressure sensor 109. When the pressure in lower filter chamber 102 exceeds either a predetermined pressure threshold or a pressure differential, particulates are flushed from filter disk 103. The flow of colloidal suspension to port 110 is stopped when a flush is initiated. Port 111 is opened to remove the colloidal suspension from lower filter chamber 102. Deionized water or another cleaning agent is transmitted into lower filter chamber 102 through port 110. The deionized water displaces the colloidal suspension in lower filter chamber 102 which is output and disposed of through port 111. The flow of deionized water is stopped after a predetermined time. Port 111 is closed after the colloidal suspension, including any agglomerates and particles that could not be reengineered, have been removed. Then, more colloidal suspension introduced into lower filter chamber 102 through port 110. Typically, upper filter chamber 101 and lower filter chamber 102 will be flushed at the same time. The small quantity of deionized water in filter 100 that is output after the flush will have little or no impact on a manufacturing process. It should be noted that rather than immediately flushing lower chamber 102 when pressure sensor 109 detects the predetermined pressure threshold or a pressure differential, a warning may be given to allow an operator to take an appropriate action.

Under normal operating conditions of filter 100, flushes are performed at periodic intervals. For example, in a semiconductor wafer manufacturing environment, wafer processing is done in wafer lots. Filter 100, normally would not need flushing within the time period required to process a complete wafer lot. Flushing of filter 100 would be routinely performed as wafer lots are changed in and out thereby having no impact on semiconductor wafer throughput in the factory. Alternatively, pressure sensor 109 could also be placed in upper filter chamber 101. In this case, a pressure reduction would indicate blinding of filter disk 103. The flushing process would be performed when the pressure fell below a predetermined pressure threshold.

Upper filter chamber 101 includes an opening for receiving ultrasonic cup 104. Ultrasonic cup 104 isolates and protects ultrasonic driver 105 from the colloidal suspension. Ultrasonic driver 105 is placed within ultrasonic cup 104. Vibrations from ultrasonic driver 105 pass through ultrasonic cup 104 into the colloidal suspension eventually impinging on and vibrating filter disk 103. Ultrasonic cup 104 allows the removal of ultrasonic driver 105 for servicing without disassembling filter 100.

Ultrasonic cup mount 106 securely fastens to upper filter chamber 101. For example, bolts vertically placed through ultrasonic cup mount 106 and into corresponding threaded openings in upper filter chamber 101 will securely hold ultrasonic cup mount 106 to upper filter chamber 101. A seal, for example an o-ring, is placed in contact with the lowermost surface of ultrasonic cup mount 106 and the uppermost surface of upper filter chamber 101 to seal upper filter chamber 101 to ultrasonic cup mount 106. The seal prevents the pressurized colloidal suspension from leaking out between upper chamber 101 and ultrasonic cup mount 106.

Ultrasonic cup 104 is securely fastened to ultrasonic cup mount 106. For example, ultrasonic cup 104 has external threads machined into its outer surface. These threads mate with female threads machined into the internal surface of ultrasonic cup mount 106. This fastening system also allows vertical adjustment of the ultrasonic cup 104 with ultrasonic cup mount 106. In addition, ultrasonic cup 104 is securely sealed to ultrasonic cup mount 106. A seal, for example, an o-ring, is placed in contact with the surface wall of the opening in ultrasonic cup mount 106 and the exterior surface of ultrasonic cup 104. The seal described above prevents the pressurized colloidal suspension from leaking out between the opening in ultrasonic cup mount 106 and the exterior surface of ultrasonic cup 104.

Upper filter chamber 101 further includes a port 107 and a port 108. Port 107 and port 108 are respectively an output port and an input port of upper filter chamber 101. Colloidal suspension, cleaning agents, or deionized (DI) water are examples of materials provided through port 108 into upper filter chamber 101. Under normal operating conditions, port 108 is closed and port 107 is open to output filtered colloidal suspension to the manufacturing environment. Port 107 is also a pathway to remove colloidal suspension and other materials from upper filter chamber 101 during a flush process, if required. Port 108 is opened to allow materials such as deionized water or cleaning agents into upper filter chamber 101 during the flush process.

In an embodiment of filter 100, upper filter chamber 101 and lower filter chamber 102 are held together by a barrel clamp (not shown). Upper filter chamber 101 and lower filter chamber 102 are sealed together. A seal, for example an o-ring, is placed in contact with the lowermost surface of upper filter chamber 101 and the uppermost surface of lower filter chamber 102 to seal upper filter chamber 101 to lower filter chamber 102. The seal prevents the pressurized colloidal suspension from leaking out between upper chamber 101 and lower filter chamber 102. Filter disk 103 is held in place by the compressive pressure of the barrel clamp holding upper filter chamber 101 to lower filter chamber 102 which also places pressure on an upper sealing ring 115 and lower sealing ring 116. In an embodiment of filter 100, a circular knife edge is placed on either the contacting surface of the upper sealing ring 115 or lower sealing ring 116. For example if the contacting surface of upper sealing ring 115 is circular in shape, the knife edge would be formed on and around the entire surface. A filter element such as a stainless steel wire mesh is placed between upper sealing ring 115 and lower sealing ring 116. The knife edge on upper sealing ring 115 compresses the filter material against the contact surface of lower sealing ring 116 forming a leakproof seal capable of withstanding pressures commonly seen in a manufacturing environment.

Figure 2:
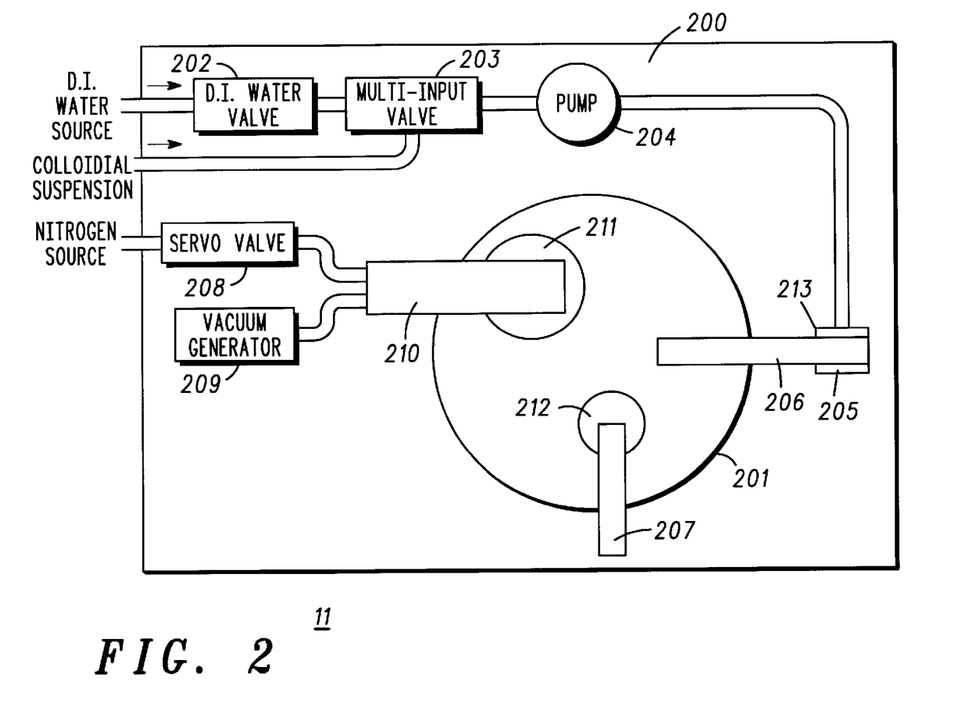
FIG. 2 is a top view of a chemical mechanical planarization tool used in the manufacture of semiconductor wafers including a colloidal suspension filter.

FIG. 2 is a top view of a chemical mechanical planarization (CMP) tool 11. Chemical mechanical planarization tool 11 utilizes both chemicals and abrasives to remove material from a semiconductor wafer. Control over the amount of the material removed and the planarity over the semiconductor wafer is essential in the fabrication of semiconductor devices. Scratching and gouging of semiconductor wafers due to large particulates in the polishing chemistries is an industry wide problem.

In general, the fabrication of semiconductor devices is shut down when large particulates are found in the global slurry delivery system or a specific CMP tool. For example, the global slurry delivery system is emptied and cleaned of all particulates at substantial cost because hundreds of gallons of colloidal suspension are thrown away. Similarly, the CMP tools contaminated by the particulates have to be flushed and cleaned. The largest cost is the down time of the CMP tools which reduces throughput of a factory. It has been estimated that some semiconductor wafer fabs have 20–30 percent down time due to polishing chemistry particulates. A test wafer is often run prior to running a wafer lot to determine the level of scratching. The test wafer prevents a wafer lot from being damaged by particulates but does not reduce the fab down time when large particulates are found. In addition, factory throughput is reduced by the time required to run test wafers.

A CMP tool 200 comprises a platen 201, deionized water valve 202, a multi-input valve 203, a pump 204, a filter 205, a dispense bar 206, a conditioning arm 207, an end effector 212, a servo valve 208, a vacuum generator 209, a wafer carrier arm 210, and a wafer carrier 211.

Platen 201 supports various polishing media and chemicals used to planarize a processed side of a semiconductor wafer. Platen 201 is typically made of metal such as aluminum or stainless steel. A motor (not shown) connects to platen 201. Platen 201 is capable of rotary, orbital, or linear motion at user-selectable surface speeds. A polishing media (not shown) is placed on platen 201. The polishing media is typically a polyurethane pad that is compliant and allows the transport of the colloidal suspension to the surface of a semiconductor wafer being polished.

Deionized (DI) water valve 202 has an input and an output. The input is connected to a DI water source. Control circuitry (not shown) enables or disables DI water valve 202. DI water is provided to multi-input valve 203 when DI water valve 202 is enabled. Multi-input valve 203 allows different materials to be pumped to dispense bar 206. Multi-input valve 203 can have as many inputs as required for the application. An example of the types of materials that are input to multi-input valve 203 are chemicals, colloidal suspensions, and deionized water. In an embodiment of CMP tool 200, multi-input valve 203 has a first input connected to the output of DI water valve 202, a second input connected to a colloidal suspension source, and an output. Control circuitry (not shown) disables all the inputs of multi-input valve 203 or enables any combination of valves to produce a flow of selected material to the output of multi-input valve 203.

Pump 204 includes an input connected to the output of multi-input valve 203 and an output connected to an input of filter 205. Pump 204 pumps material received from multi-input valve 203 to filter 205. The materials provided to pump 204 are brought in under a pressure that may be time and material dependent. Pump 204 accurately provides material at a rate required for a specific application. The rate of pumping provided by pump 204 is user-selectable which may vary depending on the material provided. Minimizing flow rate variation permits adjusting the flow to be near the minimum required flow rate, which reduces waste of chemicals, slurry, or DI water.

Filter 205 is a point of use, real time filter that is described in detail hereinabove. An input of filter 205 is connected to the output of pump 204, and an output of filter 205 is connected to an input of dispense bar 206. In addition, filter 205 has an output 213. Colloidal suspension provided from pump 204 is reengineered and filtered immediately prior to use. The removal of large particulates from the colloidal suspension at the point of use eliminates down time of CMP tool 200 due to scratching and gouging. Output 213 allows the removal and disposal of large particulates from filter 205 that cannot be reengineered.

A dispense bar manifold (not shown) may be connected into the base of dispense bar 206. The dispense bar manifold allows chemicals, slurry, or DI water to be routed to dispense bar 206. An alternate approach utilizes a pump for each material being provided to the dispense bar manifold. A filter for each material may be required if, for example, several different colloidal suspensions are provided to the dispense bar manifold for use in different planarization processes. The use of multiple pumps and filters allows the different materials to be precisely dispensed in different combinations by controlling the flow rate of each material by its corresponding pump.

Dispense bar 206 distributes chemicals, slurry, or DI water onto the polishing media surface. The input of dispense bar 206 is connected to the output of filter 205. Dispense bar 206 has at least one orifice for dispensing material onto the polishing media surface. Dispense bar 206 is suspended above and extends over platen 201 to ensure material is distributed over the majority of the surface of the polishing media.

Wafer carrier arm 210 suspends a semiconductor wafer over the polishing media surface. Wafer carrier 211 is connected to wafer carrier arm 210. Wafer carrier 211 is an assembly for holding the semiconductor wafer process side down, i.e., the side of the wafer in which the semiconductor devices are being manufactured, and maintaining a surface of the semiconductor wafer planar to the surface of the polishing media during the polishing process. Wafer carrier arm 210 applies a user-selectable downforce onto the polishing media surface. In general, wafer carrier arm 210 is capable of rotary motion as well as a linear motion. The semiconductor wafer is held onto wafer carrier 211 by vacuum.

Vacuum generator 209 is a vacuum source for wafer carrier arm 210. Vacuum generator 209 generates and controls vacuum used for wafer pickup by wafer carrier 211. Vacuum generator 209 is not required if a vacuum source is available from the manufacturing facility. Vacuum generator 209 has a port connected to a first input of wafer carrier arm 210. A first output of wafer carrier arm 210 connects to a first input of wafer carrier 211 to provide vacuum to a number of openings exposed to the surface of the semiconductor wafer being held.

Servo valve 208 provides a gas to wafer carrier arm 210 for wafer ejection after the planarization process is complete. Servo valve 208 has an input connected to a gas source and an output connected to a second input of wafer carrier arm 210. In an embodiment of CMP tool 200, the gas provided to wafer carrier arm 210 is nitrogen. A second output of wafer carrier arm 210 connects to a second input of wafer carrier 211 to provide the gas to a number of openings exposed to the surface of the semiconductor wafer. Typically, the semiconductor wafer does not need to be held by vacuum during the planarization process. The gas provided by servo valve 208 is also used to put pressure on the backside of a wafer during planarization to accurately control the wafer profile.

Conditioning arm 207 is connected to and suspends end effector 212 over the polishing media surface. End effector 212 has an abrasive surface that abrades, cleans, and planarizes the polishing media surface. End effector 212 maintains a coplanar relationship between the abrasive surface and the polishing media surface. Conditioning arm 207 is a translation mechanism used to apply end effector 212 onto a surface of the polishing media. In an embodiment of conditioning arm 207, end effector 212 is drawn linearly across the surface of the polishing media. The speed at which end effector 212 is drawn across the polishing media surface is variable to compensate for the different friction rates due to the changing velocity of the rotating polishing media as end effector 212 moves from an outer area to an inner area. Typically, conditioning arm 207 is capable of both rotational and translational motion. The pressure or downforce that end effector 212 applies to the surface of the polishing media is controlled by conditioning arm 207.

Operation of CMP tool 200 is designed to rapidly planarize a wafer lot of semiconductor wafers. A wafer lot comprises approximately 25 wafers. Total time to planarize a wafer lot is typically less than 1.5 hours. Typically, integrated circuit wafer processing steps have been performed on the wafer lot. Wafer carrier arm 210 moves to pick up a semiconductor wafer from the wafer lot. Vacuum generator 209 is enabled to hold the semiconductor wafer to wafer carrier 211. Multi-input valve 203 and pump 204 are enabled to provide colloidal suspension for the planarization process. The colloidal suspension is delivered to filter 205, filtered, and output on the polishing media by dispense bar 206. Wafer carrier arm 210 places the semiconductor wafer coplanar to the surface of the polishing media that is coated with colloidal suspension. Vacuum generator 209 is disabled. Servo valve 208 is enabled to apply a downforce via nitrogen gas on the wafer surface exposed to wafer carrier 211 to apply a controlled pressure during the planarization process. In general, the colloidal suspension is delivered continuously during the planarization process. After the planarization process is completed, servo valve 208 is disabled and vacuum generator 209 enabled to hold the semiconductor wafer to wafer carrier 211. The valve of multi-input valve 203 connecting the colloidal suspension to pump 204 is closed to prevent colloidal suspension from being wasted when a wafer is not being planarized. The semiconductor wafer is cleaned and then placed by wafer carrier arm 210 to a location where polished semiconductor wafers are stored.

Deionized water valve 202 is enabled between wafer starts. Multi-input valve 203 is enabled to allow DI water to flow to pump 204. The DI water flushes the system preventing agglomerates from forming in the colloidal suspension remaining in the lines, filter 205, and dispense bar 206. Conditioning arm 207 brings end effector 212 in contact with the polishing media after the polished wafer is removed. The DI water flush and pad conditioning of the polishing media are stopped as a new unpolished semiconductor wafer is brought to the polishing media for polishing. The process is repeated until all the semiconductor wafers in the wafer lot are polished. Filter 205 is flushed of large particulates that cannot be reengineered between wafer starts or when the wafer lot has been completely polished. The wafer lot is then taken to finish the integrated circuit wafer process steps to form complete integrated circuits.

Testing on filter 205 was performed on two types of colloidal suspensions used in the manufacture of semiconductor wafers. A first colloidal suspension is called SC1 in concentrated form or SC112 in a diluted version. SC1/SC112 is commonly used in chemical mechanical planarization processes throughout the semiconductor industry. A second colloidal suspension is called MSW 1500. MSW 1500 is not currently used in the semiconductor industry because of agglomeration problems that result in significant scratching. The colloidal suspension flow rate required in a manufacturing environment for a chemical mechanical planarization process varies between 100–300 cubic centimeters per minute depending on the specific process and colloidal suspension being used.

In general, slurries used for oxide polishing typically use a silicon dioxide particle formed by chemical vapor deposition (CVD) of $SiCl_4$ or by colloidal methods. Size of the primary particle range from 20 to 40 nanometers. These primary particles form aggregates whose sizes are at least 150 nanometers. Solids content in the aqueous final slurry solution varies from 12 to 13 percent in diluted form to about 30 percent in the concentrated slurry solution.

Colloidal silica is formed through sodium silicate directly in solution. Primary particle size is roughly the same as for fumed silica. Less agglomeration occurs with colloidal silica-based slurries. However, this type of slurry is approximately twenty percent more expensive than fumed silica slurry.

Common components in oxide polishing slurries include the abrasive particles, a pH adjusting chemical, and a buffering agent to maintain the pH. An exemplary material of the abrasive particles is silicon dioxide and exemplary materials of the pH adjusting material are potassium hydroxide or ammonia hydroxide. The pH of the colloidal suspension is carefully maintained to prevent gelation of the silica by maintaining the negative outer charge on the slurry particle, commonly referred to as zeta potential, and to increase the polishing rate. The ideal particle size depends upon the desired polish rate and the acceptable level of defects. Larger particles polish faster but cause a higher level of defects. Generally, a 0.15 to 0.20 $\mu$m particle size is an ideal compromise for semiconductor processes having device geometries in the 0.18 to 0.25 $\mu$m range. It should be noted that prior to the subject invention the particle sizes are approximately 5.0 microns because there is no effective and economical means of filtering particles below this size.

Various treatments can adversely affect particle size in a colloidal suspension. Agglomeration can occur if the colloidal suspension is allowed to sit for an extended period of time. Mixing or handling of the colloidal suspension with shear applied can cause severe agglomeration. Chilling the colloidal suspension can also increase agglomeration and gelling. Finally, lowering the pH can reduce the surface charge and increase agglomeration in the colloidal suspension.

It has been observed that the particle size can increase many-fold from time of delivery to time of use. Large particle counting techniques reveal an increase in particle size when SC1 is diluted to form SC112. For example, with SC 112, large particles go to zero counts at approximately 5 $\mu$m. Using filter 205, large particles go to zero counts at 2.5 $\mu$m. Forming SC112 through a dilution process of SC1 has large particles that go to zero counts at 15 $\mu$m. The large particles indicate that the dilution process produces agglomerates.

In the experiment, filter 205 was employed to alleviate the predictable defectivity that is caused by large particles (15 $\mu$m and greater) formed during the dilution of SC1. Ideally, a particle size of 0.15–0.20 $\mu$m is desired but the filter element available had a nominal filter rating of 2.0 $\mu$m. The absolute rating of the filter element is 5.0 $\mu$m. The screen material selected for the filter element is 316 stainless steel screen mesh which has excellent corrosion resistance and resistance to bending fatigue. As mentioned previously, the ideal filter element should be two dimensional, i.e., have an area but no depth. The thinnest screen in cross-section should be selected to prevent filter clogging by the particles permanently weaving into the filter thickness.

The area of the filter element is selected to ensure the flow rate and pressure drop are acceptable for the application. A pressure drop of approximately 1.406 kilograms/square meter (2 PSI) was used to minimize the pressure on the filter disk. There is a possibility that if the pressure drop was too high the filter disk could be damaged or it would take significantly increased power to vibrate the screen. The pressure drop also has a margin of error that allows for an increase in pressure due to blinding without affecting flow rate. The margin is 4× or 5.624 kilograms/square meter (8 PSI) that when detected initiates a flush of filter 205. Clear area of the filter element is approximately 107.5 square centimeters which corresponds to a diameter of 11.7 centimeters.

A frequency was selected that imparts kinetic energy to the agglomerated and unagglomerated particles of the colloidal suspension to cause agglomeration breakup without excessive particle movement. Excessive translational motion after the break up of a large agglomerate may initiate undesirable particle-to-particle impact thereby producing even more agglomerates. A frequency of 132 kilohertz allows small physical displacements of the solution, particles, and screen and prevents excessive high energy cavitation. In addition, the selected frequency minimizes bending fatigue of the driver and screen such that the filter does not require maintenance for extended periods of time, e.g., for example 1 year.

Both the power level of the ultrasonic driver and the distance from the ultrasonic driver to the filter disk is chosen to provide optimal kinetic energy and maximum power coupling to the filter disk. Test results show that the filter will rapidly clog with non-optimal settings because the filter is not able to reengineer particles at a rate required for the flow rate. The experimental data was run with the ultrasonic driver having a power output of 60 watts (for both SC112 and MSW1500). The distance between the ultrasonic driver and the filter disk was approximately three-fourths of the wavelength of a 132 kilohertz signal.

The speed at which the stirrer operates also has an impact on the filter process. High speed stirring, for example 2000 revolutions per minute are used to provide a cleaning action on the face of the screen and to keep the particles that cannot be reengineered in the suspension to prevent filter blinding.

One application for the SC1 colloidal suspension is for a trench polish in the manufacture of semiconductor wafers. Ideally, semiconductor manufacturers would like to accurately control the dilution of SC1 for a specific application. Purchasing diluted SC1 in the form of SC112 from the chemical manufacturer increases cost and limits the control over the exact formulation used. Diluting SC1 will produce significant agglomeration because of pH shock when adding deionized water (pH 7) to concentrated SC1 colloidal suspension (pH 12). The pH shock produces a collapse of the zeta potential which further aggravates agglomeration. Trench polishing is especially susceptible to scratching damage and thus filtering is absolutely required if SC1 is diluted.

Figure 3:
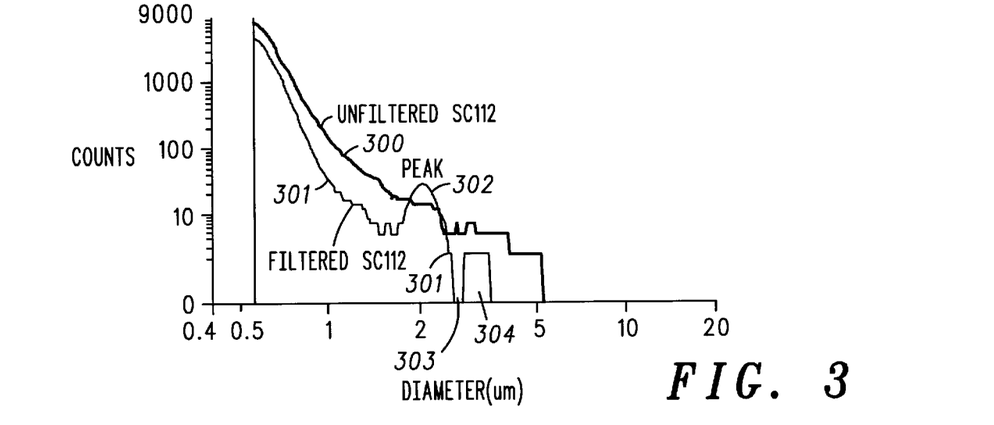
FIG. 3 is a graph of unfiltered SC112 colloidal suspension and SC112 colloidal suspension filtered in accordance with an embodiment of the present invention.

FIG. 3 is a graph of unfiltered and filtered SC112 colloidal suspension. The Y-axis lists the number of particles detected in a 60 microliter sample. The X-axis lists the diameter of the particles detected. A curve 300 represents data from unfiltered SC112. A curve 301 represents data from filtered SC112. The filter used to generate the filtered SC112 data operates as described hereinabove. SC112 is a dilute version of SC1 colloidal suspension that typically is diluted and filtered using depth media filters by the chemical manufacturer. The filtering process by the chemical manufacturers yields a 0 count particle size at approximately 5 microns.

The flow rate of the filter during testing was 150 cubic centimeters per minute which corresponds to a rate used in a manufacturing environment. The openings in the filter disk are rated at 2.0 $\mu$m nominal and 5.0 $\mu$m absolute. The clear area of the filter disk is approximately 107.5 square centimeters. The ultrasonic driver is operated at 132 kilohertz at a power level of 60 watts. The spacing between the filter disk and the ultrasonic driver is approximately ¾ of a wavelength of a 132 kilohertz signal.

Particles in the colloidal suspension greater than 2.0 $\mu$m are broken apart into smaller particles by the filter. Peak 302 of curve 301 indicates the reengineering of agglomerates from a larger size to a smaller size. Peak 302 corresponds to an increase in particles having a 2.0 $\mu$m size when compared with the unfiltered SC112. The 0 count for the filtered SC112 is indicated by point 303 of curve 301. The 0 count occurs with particles having a dimension of less than 3.0 $\mu$m. Particles larger than 2.0 $\mu$m exist after filtering because the particles are not perfectly round and thus particles having a dimension greater than 2.0 $\mu$m may pass through the filter. Also, the absolute rating of the filter is 5.0 $\mu$m which means it is possible that larger particles could pass through the filter. An area 304 under curve 301 shows the presence of particles at point 303 after filtration, i.e., a particle count greater than the zero. This anomaly is believed to be the presence of particles in the filter before the experiment was performed. The particles are located in the filtered side of the chamber prior to filtering.

Figure 4:
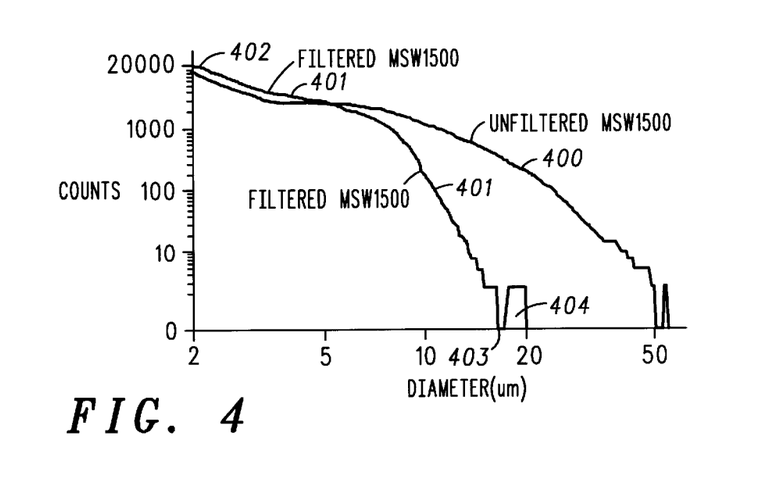
FIG. 4 is a graph of unfiltered MSW 1500 colloidal suspension and MSW 1500 colloidal suspension filtered in accordance with an embodiment of the present invention.

FIG. 4 is a graph of unfiltered and filtered MSW 1500 colloidal suspension. MSW 1500 is a colloidal suspension designed for use as metal polish for semiconductor processes having Tungsten plugs. MSW 1500 is not used because of its propensity to form agglomerates prior to use. MSW 1500 would literally shut down a semiconductor fabrication area because of large particles resulting in yield loss.

The current colloidal suspension used for a Tungsten polish is known as W-A400FE400 binary slurry. FE400 is an extremely strong oxidizing agent. W-A400/FE400 is a combination of materials that must be mixed prior to use. The mixing process exposes humans to chemicals that can cause severe burns. After mixing, W-A400/FE400 must be used within hours which corresponds to short shelf life. W-A400/FE400 also degrades a CMP tool. The FE400 erodes platens, iron oxides produced by FE400 cover wetted surfaces of the CMP tool, and the iron oxides also clog the valves, lines, and mixing apparatus.

MSW 1500 is not a health hazard and does not require mixing. Constant agitation is required by stirring in a container such as a drum or daytank or by moving the material at a velocity of greater than 1 foot per second when it is in a transfer line. The shelf life of MSW 1500 is longer than W-A400/FE400. A cost analysis has a slight advantage favoring MSW 1500 over W-A400/FE400. The purchase price is nearly identical but pad life is extended using MSW 1500. The polishing media is a polyurethane pad which is a costly consumable in the manufacture of semiconductor devices. Data indicates that a pad lasts for 700 wafer polishes using W-A400/FE400 while a pad lasts 800 wafer polishes using MSW 1500.

The performance data of the colloidal suspensions heavily favors MSW 1500. Defectivity and add-ons is 32.1 for MSW 1500 and 75.7 for W-A400/FE400. Glue selectivity is 2:1 (1:1 is excellent) for MSW 1500 and 6:1 for W-A400/FE400. Oxide selectivity is 40:1 for MSW 1500 and 50:1 for W-A400/FE400. Flat film clear time is 30 seconds faster (3:45 W-A400/FE400, 3:15 MSW 1500) for MSW 1500. Patterned wafer clear time (6,000 angstroms) is 20 seconds faster (3:15 W-A400/FE400, 2:55 MSW 1500) for MSW 1500. Clearly, semiconductor manufacturers would be using MSW 1500 if not for the agglomeration problem.

Returning to the graph of FIG. 4, the Y-axis lists the number of particles detected in a 10 microliter sample. The X-axis lists the diameter of the particles detected. A curve 400 represents data from unfiltered MSW 1500. A curve 401 represents data from filtered MSW 1500. The filter used to generate the filtered MSW 1500 data operates as described hereinabove. Curve 400 indicates large quantities of particles exceeding 20 microns in diameter for the unfiltered sample. MSW 1500 is unusable for a Tungsten polish if particles exceed 25 microns in diameter.

The flow rate of the filter during testing was 150 cubic centimeters per minute which corresponds to a rate commonly used in a manufacturing environment. The openings in the filter disk are rated at 2.0 $\mu$m nominal and 5.0 $\mu$m absolute. The clear area of the filter disk is approximately 107.5 square centimeters. The ultrasonic driver is operated at 132 kilohertz at a power level of 60 watts. The spacing between the filter disk and the ultrasonic driver is approximately three-fourths of a wavelength of a 132 kilohertz signal.

Particles in the colloidal suspension greater than 2.0 µm are broken apart into smaller particles by the filter. Peak 402 of curve 401 indicates the reengineering of agglomerates from a larger size to a smaller size. Peak 402 corresponds to an increase in particles having a 2.0 µm size when compared with the unfiltered MSW 1500. The 0 count for the filtered MSW 1500 is indicated by point 403 of curve 401. The 0 count occurs with particles having a dimension of approximately 18 microns in diameter. An area 404 under curve 401 shows the presence of particles (point 403) after filtration, i.e., a particle count greater than zero. This anomaly is believed due to the presence of particles in the filter prior to using the filter in the experiment. The particles are located in the filtered side of the chamber prior to filtering.

In theory, no particles larger than 5.0 µm should exist in curve 401. The absolute rating of the filter disk is 5.0 µm. We do not know the exact reason for this distribution, although we can hypothesize. The aspect ratio of the particles could be as high as 2:1 which would suggest that 5.0 µm particles in one dimension could be 10.0 µm in another dimension and still fit through the filter disk if aligned in the smaller dimension. Another hypothesis is that agglomeration may occur immediately after filtering. In either case, the resulting distribution of the filtered MSW 1500 reduces the largest particles to a size that will allow the colloidal suspension to be used in the manufacture of semiconductor wafers.

By now it should be appreciated that a filter that is capable of filtering a colloidal suspension has been disclosed. The filter can be operated at the point of use and is capable of flow rates required in a manufacturing environment. Moreover, the filter requires no maintenance in a time period that would produce down time in a manufacturing environment. The well known process of filtering (removing particles above a predetermined size) will not work on colloidal suspensions because of the high particle counts in a suspension. Filters rapidly blind and plug up requiring continual replacement. Removing too many of the particles by filtering can also change the chemistry of the colloidal suspension making it unusable for the application. Reengineering particles above a predetermined size into smaller particles allows a real time operating filter to be fabricated. The reengineered smaller particles pass through a filter element thereby preventing filter blinding. The chemistry is modified only by the removal of large particles that cannot be reengineered.

What is claimed is:

1. A filter having an input and an output, the filter comprising:
   a chamber having a first volume and a second volume for respectively storing unfiltered material and filtered material wherein the input of the filter couples to said first volume and wherein the output of the filter couples to said second volume;
   a vibrating apparatus coupled to said chamber for producing vibrations at ultrasonic frequencies or greater, wherein the vibrating apparatus includes a piezoelectric driver; and
   a filter element separating said first volume of said chamber from said second volume of said chamber, said filter element being responsive to said vibrating apparatus.

2. The filter of claim 1 wherein said filter element is substantially a two dimensional filter element.

3. The filter of claim 1 wherein said filter element is a wire mesh filter.

4. The filter of claim 1 further including a magnetic stirring bar in said first volume of said chamber.

5. The filter of claim 1 further including a pressure sensor coupled to said first volume of said chamber.

6. The filter of claim 1 further comprising a stirrer for stirring a volume of liquid in said first volume.

7. The filter of claim 1 as incorporated into a chemical mechanical planarization tool.

8. The filter of claim 1 wherein the filter is a point-of-use filter.

9. The filter of claim 1 wherein the vibrating apparatus is configured to vary its frequency within a frequency range during a planarization operation of the chemical mechanical planarization tool.

10. A chemical mechanical planarization tool comprising:
    a platen having a polishing media on a surface thereof;
    dispensing means for dispensing a polishing liquid on said polishing media, wherein said dispensing means includes an input and an output; and
    a filter coupled to said input of said dispensing means to provide filtered polishing liquid to the dispensing means, the filter comprising:
    a chamber having a first volume and a second volume for respectively storing unfiltered polishing liquid and filtered polishing liquid;
    vibrating means coupled to said chamber for producing vibrations at ultrasonic frequencies or greater; and
    a filter element separating said first volume of said chamber from said second volume, said filter element being responsive to said vibrating means.

11. The chemical mechanical planarization tool of claim 10 wherein said dispensing means is a dispense arm positioned above the platen.

12. The chemical mechanical planarization tool of claim 10 wherein said filter is coupled immediately to said dispense means so as to provide point-of-use filtration of the polishing liquid.

13. The chemical mechanical planarization tool of claim 10 wherein said filter element comprises a wire mesh.

14. The chemical mechanical planarization tool of claim 10 further comprising a stirring element for stirring the unfiltered polishing liquid within the first volume of said chamber.

15. The chemical mechanical planarization tool of claim 10 further comprising a pressure sensor coupled to said chamber.

16. A chemical mechanical planarization tool comprising:
    a platen having a polishing media on a surface thereof; and
    a slurry delivery system for providing slurry for dispensing on the polishing media, wherein the slurry delivery system includes, the filter comprising:
    a chamber having a first volume and a second volume;
    an input to receive slurry;
    an output to provide filtered slurry;
    a vibrating apparatus coupled to the chamber for producing vibrations at ultrasonic frequencies or greater; and
    a filter element located in the chamber, the filter element being responsive to the vibrating apparatus;
    wherein the slurry delivery system provides filtered slurry from the filter for dispensing on the polishing media.

17. The chemical mechanical planarization tool of claim 16 wherein the filter is located in the slurry delivery system to provide point-of-use filtration of the slurry.

18. The chemical mechanical planarization tool of claim 16 wherein the vibrating apparatus is configured to vary its frequency within a frequency range during a planarization operation of the chemical mechanical planarization tool.

19. A chemical mechanical planarization tool comprising:
a platen having a polishing media on a surface thereof; and
a slurry delivery system for providing slurry for dispensing on the polishing media, wherein the slurry delivery system includes, the filter comprising:
a chamber having a first volume and a second volume;
an input to receive slurry;
an output to provide filtered slurry;
a vibrating apparatus coupled to the chamber for producing vibrations at ultrasonic frequencies or greater; and
a filter element located in the chamber, the filter element being responsive to the vibrating apparatus;
wherein the first volume and the second volume have a conical taper.

20. A chemical mechanical planarization tool comprising:
a platen having a polishing media on a surface thereof; and
a slurry delivery system for providing slurry for dispensing on the polishing media, wherein the slurry delivery system includes, the filter comprising:
a chamber having a first volume and a second volume;
an input to receive slurry;
an output to provide filtered slurry;
a vibrating apparatus coupled to the chamber for producing vibrations at ultrasonic frequencies or greater; and
a filter element located in the chamber, the filter element being responsive to the vibrating apparatus;
wherein the vibrating apparatus includes a piezo-electric driver.

21. A chemical mechanical planarization tool comprising:
a platen having a polishing media on a surface thereof; and
a slurry delivery system for providing slurry for dispensing on the polishing media, wherein the slurry delivery system includes, the filter comprising:
a chamber having a first volume and a second volume;
an input to receive slurry;
an output to provide filtered slurry;
a vibrating apparatus coupled to the chamber for producing vibrations at ultrasonic frequencies or greater; and
a filter element located in the chamber, the filter element being responsive to the vibrating apparatus;
wherein the vibrating apparatus includes a driver, wherein a distance between the driver and the filter element is adjustable.

22. A chemical mechanical planarization tool comprising:
a platen having a polishing media on a surface thereof; and
a slurry delivery system for providing slurry for dispensing on the polishing media, wherein the slurry delivery system includes, the filter comprising:
a chamber having a first volume and a second volume;
an input to receive slurry;
an output to provide filtered slurry;
a vibrating apparatus coupled to the chamber for producing vibrations at ultrasonic frequencies or greater; and
a filter element located in the chamber, the filter element being responsive to the vibrating apparatus;
wherein the vibrating apparatus includes a driver, wherein a distance between the driver and the filter element is approximately an odd multiple of a fourth of a wavelength of a frequency of vibration of the vibrating apparatus.

23. A filter having an input and an output, the filter comprising:
a chamber having a first volume and a second volume for respectively storing unfiltered material and filtered material wherein the input of the filter couples to said first volume and wherein the output of the filter couples to said second volume;
a vibrating apparatus coupled to said chamber for producing vibrations at ultrasonic frequencies or greater; and
a filter element separating said first volume of said chamber from said second volume of said chamber, said filter element being responsive to said vibrating apparatus;
wherein the first volume and the second volume have a conical taper.

24. A filter having an input and an output, the filter comprising:
a chamber having a first volume and a second volume for respectively storing unfiltered material and filtered material wherein the input of the filter couples to said first volume and wherein the output of the filter couples to said second volume;
a vibrating apparatus coupled to said chamber for producing vibrations at ultrasonic frequencies or greater; and
a filter element separating said first volume of said chamber from said second volume of said chamber, said filter element being responsive to said vibrating apparatus;
wherein the vibrating apparatus includes a driver, wherein a distance between a driver and the filter element is adjustable.

25. A filter having an input and an output, the filter comprising:
a chamber having a first volume and a second volume for respectively storing unfiltered material and filtered material wherein the input of the filter couples to said first volume and wherein the output of the filter couples to said second volume;
a vibrating apparatus coupled to said chamber for producing vibrations at ultrasonic frequencies or greater; and
a filter element separating said first volume of said chamber from said second volume of said chamber, said filter element being responsive to said vibrating apparatus;
wherein the vibrating apparatus includes a driver, wherein a distance between the driver and the filter element is approximately an odd multiple of a fourth of a wavelength of a frequency of vibration of the vibrating apparatus.

* * * * *

UNITED STATES PATENT AND TRADEMARK OFFICE
CERTIFICATE OF CORRECTION

PATENT NO. : 6,592,708 B2
APPLICATION NO. : 10/142682
DATED : July 15, 2003
INVENTOR(S) : James Vanell et al.

It is certified that error appears in the above-identified patent and that said Letters Patent is hereby corrected as shown below:

In claim 16, column 20, line 54, delete "includes, the filter" and replace with --includes a filter--.

In claim 19, column 21, line 10, delete "includes, the filter" and replace with --includes a filter--

In claim 20, column 21, line 27, delete "includes, the filter" and replace with --includes a filter--

In claim 21, column 21, line 43, delete "includes, the filter" and replace with --includes a filter--

In claim 22, column 21, line 61, delete "includes, the filter" and replace with --includes a filter--

Signed and Sealed this

Twenty-first Day of November, 2006

JON W. DUDAS
*Director of the United States Patent and Trademark Office*